United States Patent
Xia et al.

(10) Patent No.: US 7,991,099 B2
(45) Date of Patent: Aug. 2, 2011

(54) CLOCK AND/OR DATA RECOVERY

(75) Inventors: Xianheng Xia, Hefei (CN); Feng Chen, Beaverton, OR (US); Weihua Zuo, Hefei (CN); Mingming Ren, Hefei (CN)

(73) Assignee: Lontium Semiconductor Corp., Hefei (CN)

( * ) Notice: Subject to any disclaimer, the term of this patent is extended or adjusted under 35 U.S.C. 154(b) by 724 days.

(21) Appl. No.: 12/061,546

(22) Filed: Apr. 2, 2008

(65) Prior Publication Data

US 2009/0252265 A1     Oct. 8, 2009

(51) Int. Cl.
H04L 7/00         (2006.01)

(52) U.S. Cl. .................. 375/355; 375/340; 375/259

(58) Field of Classification Search .............. 375/259, 375/340, 342, 355, 371; 327/141
See application file for complete search history.

(56) References Cited

U.S. PATENT DOCUMENTS

| | | | | |
|---|---|---|---|---|
| 5,483,558 | A * | 1/1996 | Leon et al. | 375/376 |
| 7,386,042 | B1 * | 6/2008 | Brewer | 375/226 |
| 7,596,175 | B2 * | 9/2009 | Chen | 375/229 |
| 7,606,297 | B2 * | 10/2009 | Waschura et al. | 375/224 |
| 7,627,029 | B2 * | 12/2009 | Ho et al. | 375/229 |
| 2010/0020861 | A1 * | 1/2010 | Leibowitz et al. | 375/231 |
| 2010/0074314 | A1 * | 3/2010 | Stojanovic et al. | 375/226 |

OTHER PUBLICATIONS

Friedman et al., "SiGe BiCMOS integrated circuits for high-speed serial communication links" IBM J. Res. & Dev. vol. 47, No. 2/3, Mar./May 2003, pp. 259-282.
Fiedler et al., "A 1.0625 Gbps transceiver with 2x-oversampling and transmit signal pre-emphasis" (abstract only) IEEE Xplore, Solid-State Circuits Conference, Digest of Technical Papers, 44th ISSCC, 1997, 3 pgs.
Song et al., "A 4-Gb/s Clock and Data Recovery Circuit Using Four-Phase 1/8-Rate Clock" ESSCIRC, 2002, pp. 239-242.
Razavi et al., "A 10 Gb/s CMOS clock and data recovery circuit with frequency detection" (abstract only) IEEE Xplore, Solid-State Circuits Conference, Digest of Technical Papers, ISSCC, 2001, 2 pgs.
Savoj et al., "Design of Half-Rate Clock and Data Recovery Circuits for Optical Communication Systems" DAC 2001, Jun. 18-22, 2001, 6 pgs.
Anand et al., "A CMOS Clock Recovery Circuit for 2.5-Gb/s NRZ Data" IEEE Journal of Solid-State Circuits, vol. 36, No. 3, Mar. 2001, pp. 432-439.

* cited by examiner

*Primary Examiner* — Jean B Corrielus (74) *Attorney, Agent, or Firm* — Berkeley Law & Technology Group, LLP (57) ABSTRACT

Embodiments for clock and/or data recovery may comprise two or more samplers to sample a relatively small number of distinct data sample phase locations of a data pulse relative to an estimate of the location of a center of the data pulse. Signal level values for the sample phase locations may be compared, and sample locations for one or more other data pulses may be adjusted based at least in part on the comparisons.

15 Claims, 11 Drawing Sheets

CLOCK AND/OR DATA RECOVERY

BACKGROUND

Subject matter disclosed herein may relate to clock and/or data recovery.

As interfaces between digital electronic devices or components in computing platforms, or between units within integrated circuits, increase in transmission speed, noise or signal integrity issues may become more complex. Clock and/or data recovery is one area in which these issues may surface.

A clock and/or data recovery process may be made more difficult due at least in part to environmental variables. For example, temperature or operating voltages for the electronic devices or components may vary over time, resulting in changes in some operating parameters within the electronic device or component. In the case of data and/or clock data recovery operations, due at least in part to the relatively high data transfer rates, an amount of precision is desirable. This is therefore an area of continuing technological development.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized. Furthermore, structural or logical changes may be made without departing from the scope of claimed subject matter. It should also be noted that directions or references, for example, up, down, top, bottom, and so on, may be used to facilitate discussion of the drawings and are not intended to restrict the application of claimed subject matter. Therefore, the following detailed description is not to be taken to limit the scope of claimed subject matter or their equivalents.

DETAILED DESCRIPTION

In the following detailed description, numerous specific details are set forth to provide a thorough understanding of claimed subject matter. However, it will be understood by those skilled in the art that claimed subject matter might be practiced without these specific details. In other instances, well-known methods, procedures, components or circuits have not been described in detail.

The terms, "and," "and/or," and "or" as used herein may include a variety of meanings that will depend at least in part upon the context in which it is used. Typically, "and/or" as well as "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe some combination of features, structures or characteristics. Though, it should be noted that this is merely an illustrative example and claimed subject matter is not limited to this example.

Unless specifically stated otherwise, as apparent from the following discussion, it is appreciated that throughout this specification discussions utilizing terms such as "processing," "computing," "calculating," "selecting," "forming," "enabling," "inhibiting," "identifying," "initiating," "querying," "obtaining," "hosting," "maintaining," "representing," "modifying," "receiving," "transmitting," "storing," "determining" or the like refer to the actions or processes that may be performed by a computing platform, such as a computer or a similar electronic computing device, that manipulates or transforms data represented as physical, electronic or magnetic quantities or other physical quantities within the computing platform's processors, memories, registers, or other information storage, transmission, reception or display devices.

A computing platform refers to a system or a device that includes the ability to process or store data in the form of signals. Thus, a computing platform, in this context, may comprise hardware, software, firmware or any combination thereof. For one or more embodiments, a computing platform may comprise any of a wide range of digital electronic devices, including, but not limited to, personal desktop or notebook computers, high-definition televisions, digital versatile disc (DVD) players or recorders, game consoles, satellite television receivers, cellular telephones, personal digital assistants, mobile audio or video playback or recording devices, and so on. Further, unless specifically stated otherwise, a process as described herein, with reference to flow diagrams or otherwise, may also be executed or controlled, in whole or in part, by a computing platform.

Figure 1:
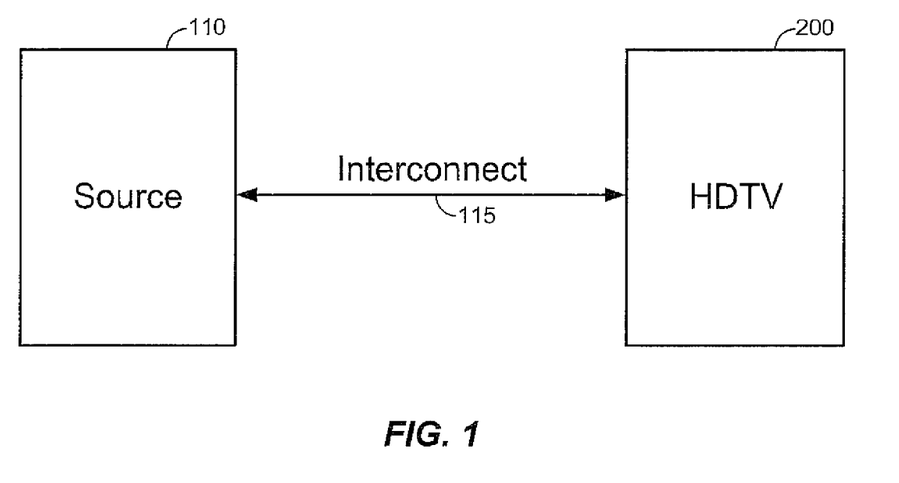
FIG. 1 is a block diagram depicting an embodiment of an audio/video transmission system.

FIG. 1 is a block diagram depicting an embodiment of an audio/video transmission system. Here, an example audio/video source 110 is shown coupled via an interconnect 115 to an example high-definition television (HDTV) 200. For this particular example embodiment, audio/video source 110 may transmit audio and/or video data signals to HDTV 200 via interconnect 115. Likewise, for this particular example embodiment, interconnect 115 may transmit signals in a manner that complies with or is compatible with the High-Definition Multimedia Interface (HDMI) specification, version 1.3V, 2006, although the scope of claimed subject matter is not limited in this respect. For this particular example embodiment, audio/video source 110 may transmit both audio and/or video data signals via interconnect 115, although again, the scope of claimed subject matter is not limited in this respect.

Although one or more of the embodiments described herein may comprise an HDTV, other embodiments are, of course, possible. Clock and/or data recovery may be employed in any of a wide range of digital electronic devices, including, for example, any of the types of computing platforms mentioned above. Further, although example embodiments discussed herein refer to HDMI compliant or compatible interconnects, devices or systems, the scope of claimed subject matter is not so limited. Clock and/or data recovery embodiments described herein, for example, may be utilized in connection with any of a wide range of signaling or information transmission protocols or specifications, including, but not limited to, serial specifications, such as, for example, serial ATA [Advanced Technology Attachment 2.6 Specification, released February, 2007], parallel specifications, such as for example, parallel ATA [NCITS (National Committee for Information Technology) 340-2000, AT Attachment with Packet Interface-5] or specifications that employ differential signaling, to provide only a few possible examples. Likewise, such specifications or protocols may be employed in a variety of environments, such as for example, between separate devices, as illustrated by the embodiment shown in FIG. 1, between separate components within a device, between separate circuits within a device, or between electrically separate on chip sub-components of semiconductor chip or integrated circuit, again to provide only a few examples.

In some embodiments, interconnect 115 may not necessarily transmit a clock signal, as such, while in other embodiments a clock signal may specifically be provided in addition to other signals intended to transmit data, for example. For embodiments in which no clock signal is transmitted to HDTV 200 via interconnect 115, here, for example, HDTV 200 may process data signals received via interconnect 115 to determine acceptable timing. Such timing may be employed in connection with sampling signals transmitted via interconnect 115, for example.

In one or more such embodiments, this processing may produce a clock signal that may be used by HDTV 200 to further process an incoming or received data stream. Likewise, for embodiments in which a clock signal is also transmitted via interconnect 115, it may be desirable to process an incoming data stream as a mechanism to obtain additional timing information. Operations or processing to determine timing information associated with data signals of a received data stream may be referred to as clock recovery. Operations or processing to determine signal level information or signal values associated with data signals of a received data stream may be referred to as data recovery. Likewise, in this context, clock and/or data recovery operations may sometimes be abbreviated as "CDR" or as "CDR operations."

In performing CDR operations on an incoming data stream, HDTV 200, for example, in this particular embodiment, may undertake to approximate timing information to facilitate data reception. Likewise, it is also appreciated that such CDR operations may be performed external to HDTV 200. For example, a transmission integrated circuit between source 110 and HDTV may be employed to perform such operations, although may other approaches are likewise possible. However, in this particular embodiment, we assume that CDR is performed internal to HDTV 200.

For a data signal or data pulse of a data stream being transmitted via interconnect 115 to HDTV 200, there may be a portion of the data signal or pulse in which signal level information, also referred to as a signal value, reflected by the received pulse provides a valid or correct indication of the information being transmitted. Thus, if voltage signal level for that pulse were measured at an appropriate location or an appropriate time, such as by sampling the voltage signal level for the data pulse, for example, a valid indication of whether a digital one or a digital zero is intended will be obtained by HDTV 200. Here, in this context, this is referred to as a valid state for that particular data pulse.

Of course, it is desirable that such valid states be obtained by HDTV 200. If too many invalid states are obtained, that is, invalid indications of whether a digital one or a digital zero is intended for a variety of data signals that are received, performance of the HDTV, for example, may be affected. Thus, an aspect of data recovery in this particular context is to perform sufficient processing of a received or incoming data stream so that an adequate level of signal integrity with respect to the data stream is obtained.

In this context, a portion of a data pulse or data signal being received that reflects a valid state for that signal or pulse may be referred to as a data eye. By contrast, for the portion of a data pulse outside of such a data eye, the signal level value of that particular pulse, such as the voltage level, for example, may appear uncertain or be unknown. Likewise, it follows that sampling a data pulse outside of a data eye may result in an invalid state and, therefore, may produce an error in transmission. This, of course, may have undesirable downstream consequences for an overall system, such as illustrated in FIG. 1. For this particular embodiment, for example, reduced performance or unreliable operation by the HDTV may result. In general, it is believed that sampling a data pulse closer to the center of its data eye may result in improved or a higher level of signal level value integrity. Therefore, to reduce the incidence of invalid states, for example, it may be desirable to sample a data pulse reasonably close to the center of its data eye.

As previously discussed, a clock and/or data recovery process may be made more difficult due at least in part to a host of potential environmental factors. For example, operating temperatures, external temperatures or operating voltages for electronic devices or components may vary, in some instances over time, potentially resulting in changes in some operating parameters within the electronic device or component. These changes could, for example, potentially produce one or more fluctuations in timing for the data pulses of an incoming data stream. If one, therefore, were attempting to sample reasonably close to the center of a data eye, as indicated above, it may be desirable, for example, to adjust the timing associated with such sampling so that signal level value sampling, intended to be relatively close to the center of the data eye of the pulse, at least approximately tracks such timing fluctuations.

For this example embodiment, interconnect 115 comprises a serial interconnect utilizing differential signaling. Of course, this is merely one possible example and the scope of claimed subject matter is not limited in this respect. For this example embodiment, as illustrated in FIG. 2, a clock/data recovery unit 600 may provide to core logic unit 220 a recovered clock signal 611 and a recovered data signal 631, as described in more detail below.

Clock generator 210 may provide a clock signal 211 to clock/data recovery unit 600. For this particular embodiment, clock generator 210 may comprise a phase-locked loop (PLL). Other embodiments may comprise a delay-locked loop (DLL). However, these are merely examples of clock generator circuits, and the scope of claimed subject matter is not limited in this respect. Other techniques for generating a clock signal are possible and intended to be included within the scope of claimed subject matter.

Figure 2:
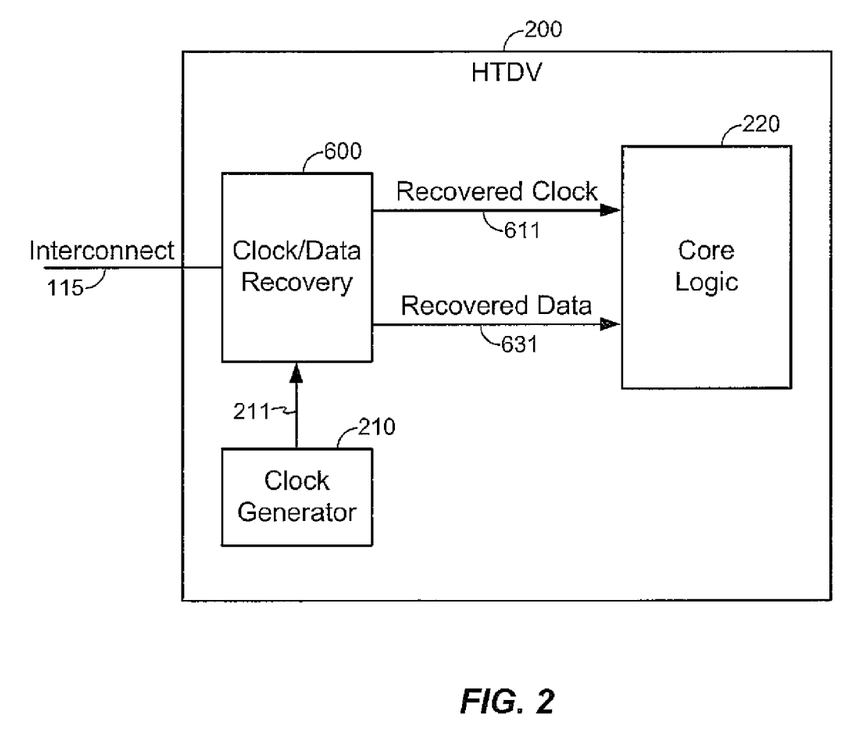
FIG. 2 is a block diagram of an element of FIG. 1, shown in greater detail.
Figure 6:
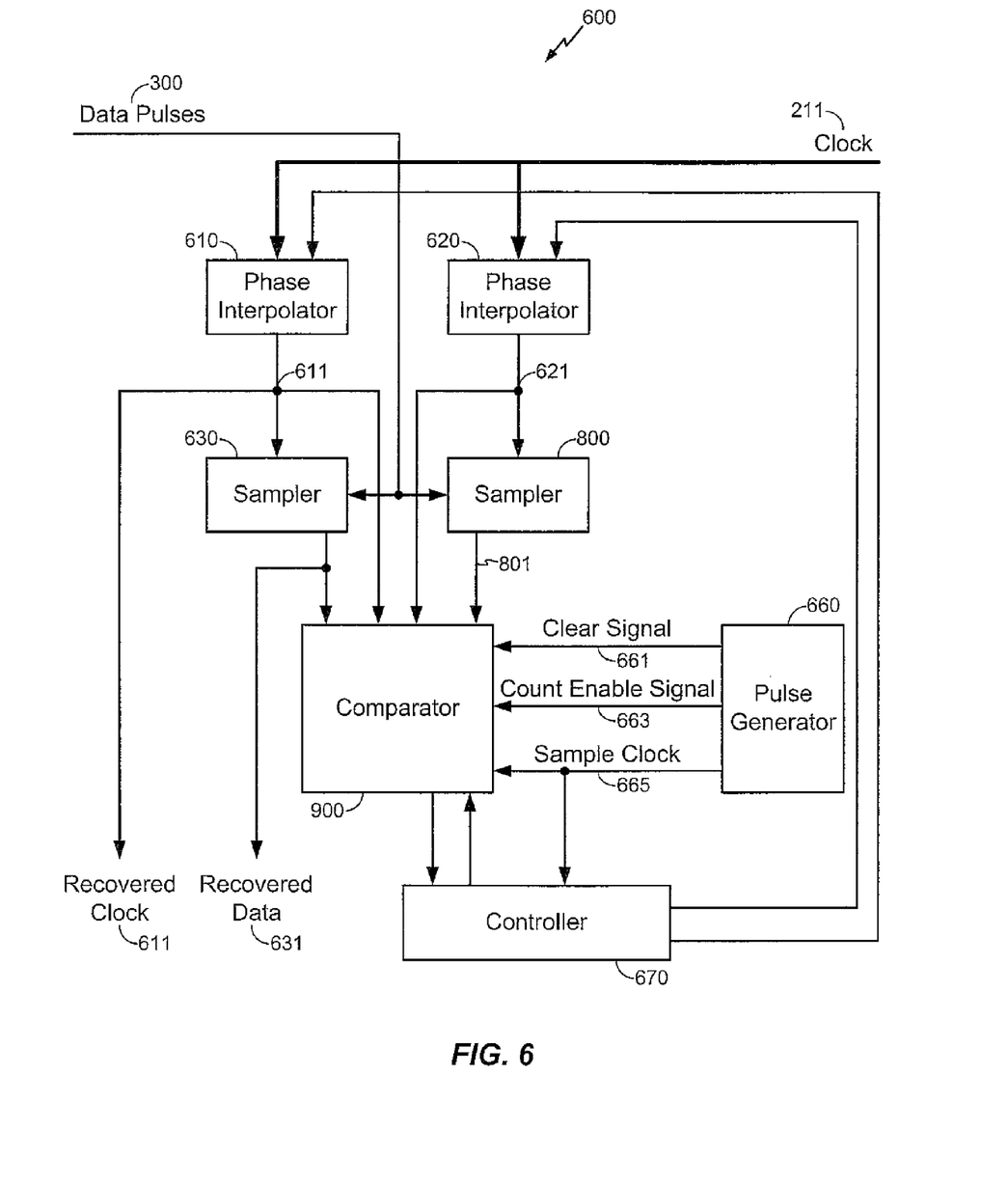
FIG. 6 is a block diagram of an example embodiment of a clock and/or data recovery unit.

Referring more particularly to clock/data recovery unit 600, shown in FIG. 2 and shown in more detail in FIG. 6, in accordance with one or more embodiments, a process for recovering clock timing information and/or signal level value information from a stream of data signals may comprise finding an approximate center of a data pulse, and may also comprise adjusting the approximation based at least in part on sampled signal value levels for a relatively small number of locations obtained within suspected signal value level transition regions, such as voltage signal level transitions, for the data pulse. Such sampling may be employed to detect relative movement of such transition regions over time as described in more detail below. As used herein, the term "transition region" is meant to include a period of time immediately surrounding a change in a signal from one logical voltage level to another logical voltage level. One particular embodiment of a process, for example, may comprise comparing signal levels of a few distinct sample locations for one or more data pulses, and adjusting sample locations based at least in part on the comparisons. In another embodiment, however, instead or in addition, an estimate of the location of the center of the data pulse or the data eye may, for example, be adjusted.

For this particular embodiment, again, shown in FIG. 2, and shown in more detail in FIG. 6, two samplers, for example, may be utilized to perform sampling of a data pulse, as described in more detail below, although claimed subject matter is not limited in scope in this respect. The two samplers may sample a relatively small number of distinct data sample locations of the data pulse. Likewise, for this particular embodiment, such locations may be chosen relative to an estimate of the location of the center of a data eye of a data pulse, which in this particular example is also relative to the center of the particular data pulse, although claimed subject matter is not limited in scope in this respect. While immediately proceeding, we have referred to sample locations; a relationship may exist between one or more particular sample locations of a data pulse and one or more particular sample times for that pulse. For example, based at least in part on the frequency of a particular data stream, a one-to-one relationship may exist between such locations and such sample times. Another approach to illustrating this point is by recognizing that frequency and wavelength, in general, are related and usually treated as interchangeable. For the remaining embodiments discussed, therefore, we shall treat sample locations, sample times, and sample phases as nearly interchangeable, although claimed subject matter is not limited in scope to this aspect of such embodiments.

Figure 3:
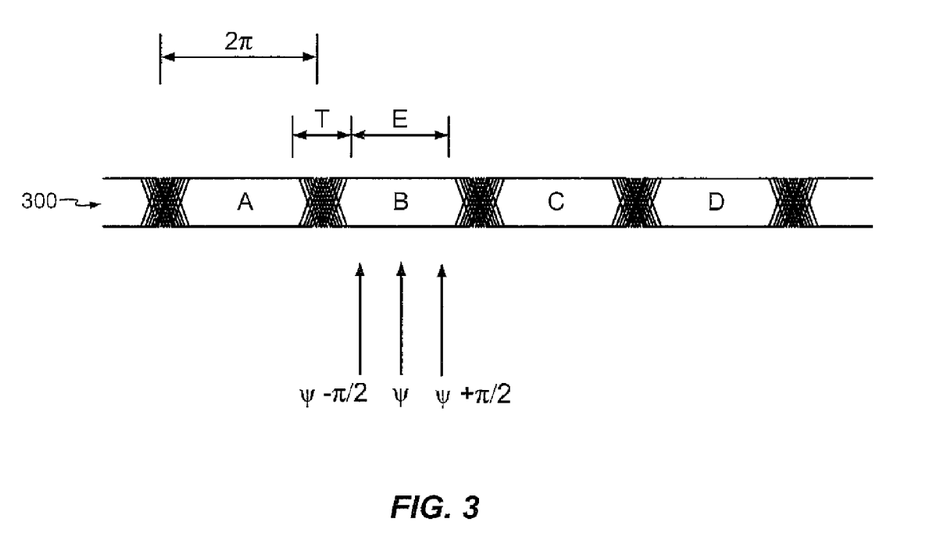
FIG. 3 is a timing diagram depicting a variety of data sample phase locations.

FIG. 3 is an example timing diagram in accordance with one or more embodiments. Data signals or pulses 300 represent a data stream received at clock/data recovery unit 600 via interconnect 115 for this particular embodiment. Here, data signals 300 comprise, for example, pulses A, B, C, and D, as depicted in FIG. 3. A data pulse may represent a period of time during which a single bit of information may be communicated. In this context, a bit refers to an electronic signal intended to communicate a single unit of information, that single unit of information having a logical value in which the value may comprise either a logical "1" or a logical "0." For this particular situation in which bits of information are transmitted via data pulses, such individual pulses may, at times, be referred to as a bit-time. Likewise, for the example embodiments described herein, a convention shall be employed that a data pulse or bit time may comprise a period of $2\pi$ radians or 360° degrees. Of course, claimed subject matter is not limited in scope to employing this convention. Rather this convention is employed merely for purposes of convenience of discussion.

For this particular embodiment, data/clock recovery unit 600 approximates a location for the center of the data pulse, in this example, the center of the data pulse also comprising the center of the data eye the particular pulse. For any particular embodiment employing samplers, such as in this embodiment in which two samplers are employed, it is desired to establish a phase relationship between the samplers. For example, without intended to limit the scope of claimed subject matter, for this particular example embodiment, the phase relationship may comprise $\pi$ radians or 180° degrees. However, the details of how this is accomplished for this particular embodiment are described in more detail below.

Nonetheless, for this particular embodiment, it should clear that the samplers are arranged so that a particular received data pulse is sampled at different times or equivalently at different locations and, therefore, the samplers may potentially sample different signal level values, as also explained in more detail below. This aspect of the relative operation of the samplers, as described below, is employed to approximate the center of a data pulse.

An aspect of the samplers relates to the particular timing, or equivalently the particular location, for the samplers to sample the signal level or signal value of a received data pulse. For the example embodiments described herein, two clock phase interpolators, discussed more fully below, primarily control the particular timing for such sampling. In general, however, for this particular embodiment, the phase interpolators drive the samplers at particular phases or sample phases so that signal level values are sampled across the data pulse and, in this way, the center of the data pulse may be approximated. Also, recall, as explained previously, that the samplers for this particular embodiment are $\pi$ radians or 180° degrees out of phase. Of course, other relative relationships may be employed; however, as an example, for this particular relationship, to obtain a set of sampled signal value levels across a data pulse of $2\pi$ radians or 360° degrees, one sampler may be employed to obtain a set of sampled signal value levels across half of the data pulse, here $\pi$ radians or 180° degrees of the pulse. As a result, the other sampler will have likewise obtained a set of sampled signal value levels for the other half or other $\pi$ radians/180° degrees of the particular data pulse. Therefore, together, the two samplers will obtain the desired set of sampled signal value levels.

A sampler is driven by an associated phase interpolator for this particular embodiment. Therefore, a phase interpolator may provide appropriate timing so that a sampler may obtain a set of sample signal values, as discussed immediately above, at particular sample phases. In one particular embodiment, phase interpolators may produce sample phases at regular intervals. For example, if I is the number of sample phases out of 180°, and if I is eighteen, a sample phase may be 10° different from a previous sample phase. Because there are two samplers for this particular embodiment, the total number of data phase sample locations for this example is thirty-six. Two samplers performing eighteen samples at 10° phase intervals, therefore, in this particular embodiment, are intended to cover or span a data pulse.

For this particular embodiment, to find the approximate center of the data eye of the data pulse, two phase interpolators may cycle through the sample phases with a number of samples being taken at a sample phase location and then averaged, to obtain a value for the particular sample phase location. Thus, a series of signal level values may be generated. Of course, it may be desirable in some embodiments to cycle through the sample phases in more than one pass in order to generate additional data that may produce more accurate results. For example, the signal values obtained on different passes may be averaged.

Signal level values obtained by sampling may be compared. If both samplers, sampling the signal at different phases, sample substantially the same signal value level, a comparison, such as taking the difference, for example, may result in a value of '0' for this example, although the scope of claimed subject matter is not limited in this respect. However, likewise, by employing logical values, as previously described, alternatively, a logical comparison may be employed, such as exclusive OR ('XOR'). Therefore, if the sample values were both logical '1' or were both logical '0,' applying this operation would produce a logical '0'; however, if the sample values are different, then this operation would produce a logical '1'. Of course, it is recognized that this is merely a convention and an alternate convention of logical zeros or logical ones may likewise be employed.

Continuing with this embodiment, however, comparing the sampled signal value levels from two samplers, for example, may locate or approximately locate the data eye of the pulse. For example, referring to FIG. 3, as described in more detail below, a string of comparisons resulting in a value of '0' may indicate the data eye. In FIG. 3, as explained previously, $2\pi$ radians indicates the length of a data pulse in terms of phase. Likewise, T denotes a portion of a pulse in which the signal level is uncertain, as previously described, whereas E denotes a portion in which the signal level is certain. Thus, E denotes the portion of the pulse that is the data eye. T is sometimes referred to as jitter. As illustrated for data pulse B, '$\psi$' points to the approximate center of the data eye and, therefore, the approximate center of the data pulse. As described previously, therefore, employing two samplers approximately separately by $\pi$ radians and determining the XOR of the signal level values, produces a series of logical '0's, which indicate the location of the data eye.

For one or more embodiments, the data eye center may be computed more than once to verify results. However, the scope of claimed subject matter is not limited in this respect. Further, for one or more embodiments, estimates may be made for the extent of the data eye, and these estimates of the edges of the data eye may be labeled $\psi-\pi/2$ and $\psi+\pi/2$, as depicted in FIG. 3, although again, the scope of claimed subject matter is not limited in this respect. Of course, $\psi-\pi/2$ and $\psi+\pi/2$ indicate locations of $-45°$ and $+45°$, respectively, from the approximate center $\psi$ of the data eye. Thus, in this particular embodiment, for data pulses received via interconnect 115, approximate center $\psi$ serves as the phase sample location to sample a received data pulse for one or more embodiments.

Figure 4:
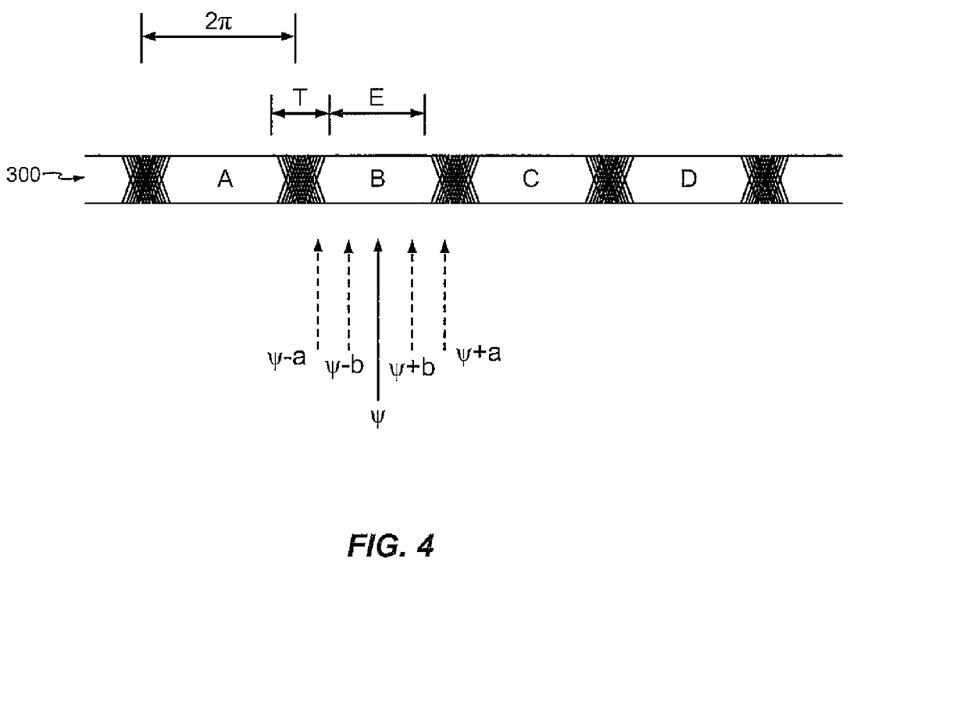
FIG. 4 is another timing diagram depicting a variety of data sample phase locations.

Likewise, in another embodiment, further signal level samples may be taken in areas surrounding data transition locations in an effort to track potential fluctuations in timing of data eye center edges. By tracking fluctuations in the edges, adjustments may be made to the approximation of the data eye center so that received data pulses are sampled relatively close to the center of the data pulse. FIG. 4 is an example timing diagram depicting possible sample phase locations for tracking movement of the edges of the data eye. In contrast to approaches that may utilize a large number of sample locations, for this particular embodiment, a relatively small number of sample locations may be employed. For example, in this example embodiment, the number of sample locations may be four, although the scope of claimed subject matter is not limited in this respect. Other embodiments are possible using other numbers of sample locations.

For this particular embodiment, a sampler may sample signal level values at $\psi$ (the previously determined approximate data eye center). For this embodiment, as depicted in FIG. 4, another sampler may sample data at phase locations designated as $\psi-a$, $\psi-b$, $\psi+b$, and $\psi+a$, where 'a' and 'b' are selected to produce samples of the signal value level at sample locations surrounding the previously estimated data eye edges, although the scope of claimed subject matter is not limited in this respect. Thus, for this particular embodiment, the second sampler may sample data at phase sample locations at $(\psi-\pi/2)-2\pi/I$, $(\psi-\pi/2)+2\pi/I$, $(\psi+\pi/2)-2\pi/I$, $(\psi+\pi/2)+2\pi/I$, where I in this example is eighteen as previously indicated, although claimed subject matter is not limited in scope to these particular sample locations, of course. These data sample phase locations for this example embodiment may be $\pi/I$ phase apart from the previously determined data edges. For other embodiments, the coordinates of the four sample positions may be set to be apart from the previously determined data edges by an alternate amount, and, in so doing, tolerance to data jitter may increase. However, for at least this embodiment, it may be advantageous to not set coordinates of the four sample positions more than one half of the data eye apart otherwise a potential situation may arise in which it may be difficult to converge to a stable state, although, again, claimed subject matter is not limited in scope to this particular embodiment.

Comparisons may be made between the sampled signal level values and the signal level value at the previously determined center $\psi$. In one embodiment, for example, comparisons may produce four values. As discussed above, for this particular embodiment, an exclusive OR comparison may be employed, although claimed subject matter is not limited in scope to this particular approach. If the sampled signal level value at one of the four sample locations matches the sampled signal level value of the data sampled at $\psi$, for this embodiment, the result may comprise a value of '0'. Otherwise, the result of the comparison may comprise '1', for an example embodiment. Of course, the scope of claimed subject matter is not limited in this respect.

Thus, for this embodiment, if the comparisons produce values of 1,0,0,0 for the sample locations, depicted left-right in FIG. 4, timing for the data eye edges may have retarded by some degree (moved to the right in FIG. 4), and, thus, the approximated center $\psi$, may be retarded (moved to the right in FIG. 4) by some amount to compensate at least in part for movement of the data eye. Conversely, if the comparisons produce values of 0,0,0,1 for the sample locations depicted, left-right in FIG. 4, timing for the data eye edges may have advanced by some degree (moved to the left in FIG. 4), and the approximated center $\psi$, may be advanced (moved to the left in FIG. 4) by some amount in order to compensate at least in part for fluctuations in timing of the data eye.

An adjusted position of $\psi$ may then serve as a basis for further sampling and comparisons for further adjustments based at least in part upon tracked movement of the data eye, such as described above. This particular embodiment in which a relatively small number of sample locations are utilized may result in relatively quick processing in comparison, for example, with approaches utilizing larger numbers of sample locations. This improved processing speed, in this particular embodiment, may result in reacting to movement of the data eye more quickly, thereby providing more bandwidth to track jitter and potentially result in increased reliability. Furthermore, this particular embodiment may reduce clock loading and/or provide power consumption advantages since, here, fewer samplers may be employed. In some embodiments, of course, several iterations to perform the comparisons described above may be advantageous, although claimed subject matter is not limited in scope in this respect.

Now, referring to more detailed FIG. 6 with respect to this particular embodiment, CDR 600 may comprise phase interpolators 610 and 620, samplers 630 and 800, a comparator 900, a controller 670, and a pulse generator 660. These components for this particular embodiment shall be described in more detail below. Samplers 630 and 800, here, receive data pulse via interconnect 115. These samplers, in this embodiment, sample data pulses 300 according to clock signals 611 and 621, produced by phase interpolators 610 and 620, respectively. Phase interpolators 610 and 620, for this example embodiment, receive clock signal 211 from clock generator 210. Also for this example embodiment, controller 670 may provide one or more control signals to phase interpolators 610 and 620 to direct the interpolators with respect to the alignment of the phase of the signals applied to the samplers, as described in more detail below.

For this particular embodiment, as previously explained, the phase relationship between samplers 630 and 800 may be set at $\pi$ (180°), although claimed subject matter is not limited in scope in this respect. Thus, here, for this embodiment, 630 and 800 receive clock signals that are 180° out of phase. As a result, the samplers sample a particular data pulse at different times, and may, therefore, sample different signal value levels, as previously suggested. To determine if the sampled signal value levels are different, a comparison is made. Here, comparator 900 receives sampled signal value levels from samplers 630 and 800.

Figure 9:
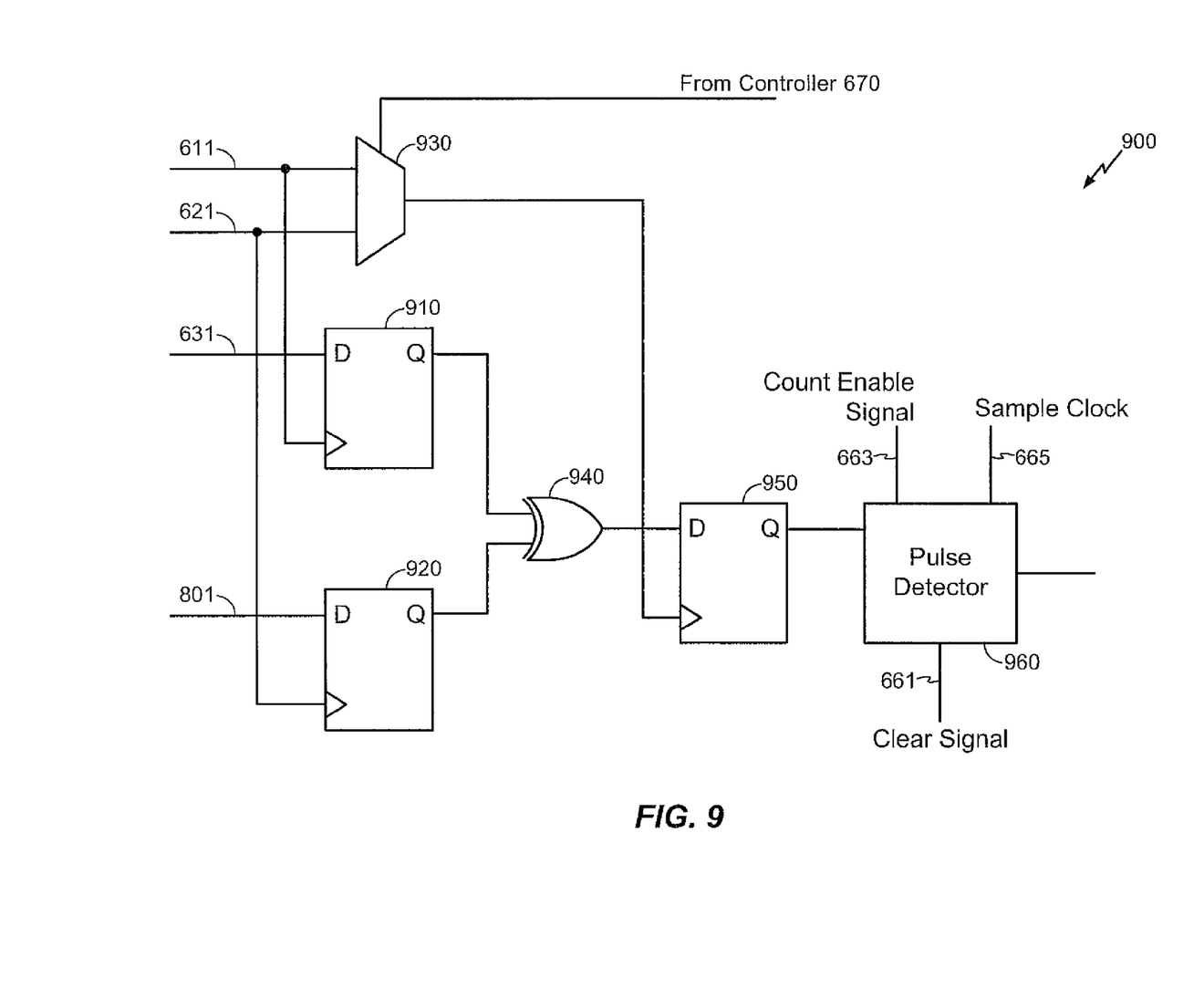
FIG. 9 is a block diagram of another element of FIG. 6, shown in greater detail.

FIG. 9 is a block diagram of an example embodiment of comparator 900. In this embodiment, flip-flops 910 and 920 have q output ports coupled to input ports of an XOR logic circuit 940. Comparator 900 further comprises a multiplexer (MUX) 930 that may deliver one of clock signal 611 or 621 to a flip-flop depending at least in part on a control signal received from controller 670. Clock signals 611 and 621 are further applied to flip-flops 910 and 920, as illustrated. Flip-flop 950 for this embodiment may receive an output signal from XOR 940, which, for this particular embodiment comprises a comparison of signal value levels that have been latched by the flip-flops. Thus, the output signal of XOR 940 is applied to pulse detector 960, may be employed as described in more detail below in connection with FIG. 7. Further, as depicted in FIG. 6, comparator 900 provides an output signal to controller 670, for the example embodiments described herein. However, this is merely an example embodiment of a comparator, and the scope of claimed subject matter is not limited in this respect. Many other implementations of a comparator are possible and are intended to be included within the scope of claimed subject matter. This particular embodiment is merely provided as one illustrative example.

In response to a determination of the approximate center of the data eye, further signal value levels may be sampled at sample locations by sampler 800. For example, areas surrounding signal value level transitions may be sampled at sample locations in an effort to track movement of the edges of the data eye, for example.

Figure 8:
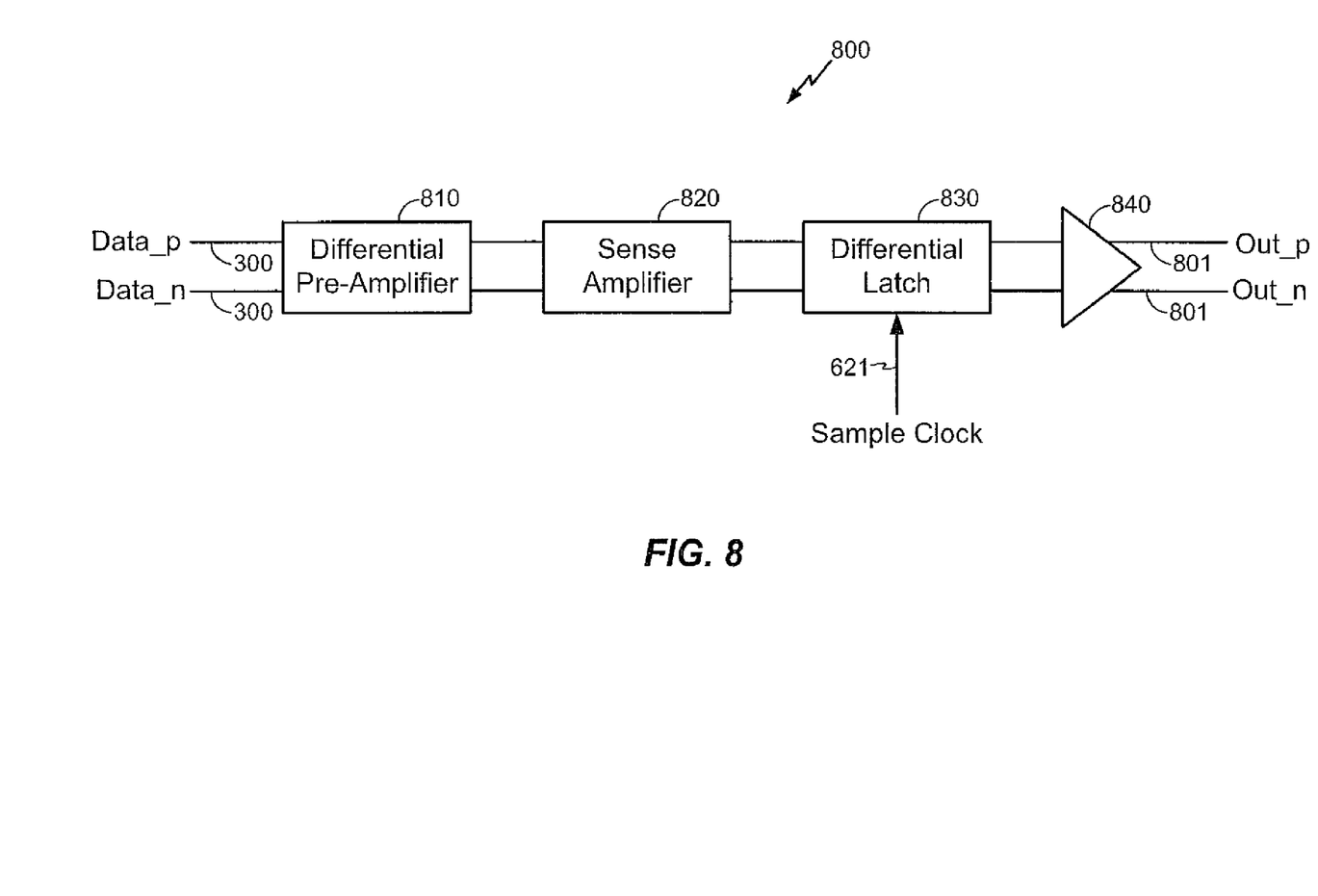
FIG. 8 is a block diagram of an element of FIG. 6, shown in greater detail.

FIG. 8 is a block diagram of an example embodiment of sampler 800, although, of course, claimed subject matter is not limited in scope in this respect. For this example embodiment, and as mentioned previously, a data pulse 300 may be provided in the form of a part of signals, labeled as Data_p 300 and Data_n 300, for example. Of course, again, claimed subject matter is not limited in scope in this respect; however, continuing with this particular embodiment, a differential pair of signals for a particular data pulse may be received at a differential pre-amplifier 810 that may serve to strengthen or amplify the received signals, in preparation to be sensed at sense amplifier 820. Sense amplifier 820 may detect variations in voltage signal value levels between the differential pair of signals, and may amplify the voltage difference between the differential pair of signals. A differential latch 830 may latch the signal value level of the output signal of sense amplifier 820 in response to an assertion of a clock signal 621 indicating that the signal value level of the output be sampled. A buffer circuit 840 may receive the latched or sampled signal value level so that it may be applied to comparator 900, for example. Of course, this is merely an example embodiment of a sampler circuit, and the scope of claimed subject matter is not limited in these respects.

As discussed above, for one or more embodiments, a relatively small number of sample locations may be utilized to track movement of signal value level transitions. For one or more example embodiments, the number sample locations may be four, although the scope of claimed subject matter is not limited in this respect. Other embodiments are possible using other numbers sample locations, of course.

A series of comparisons may be made between sampled signal value levels and the signal value level of the data sampled at the previously determined center $\psi$. For this particular embodiment, pulse generator 660 may transmit various control signals to comparator 900 for these comparisons to occur. These signals are discussed in more detail below in connection with FIG. 7.

Figure 7:
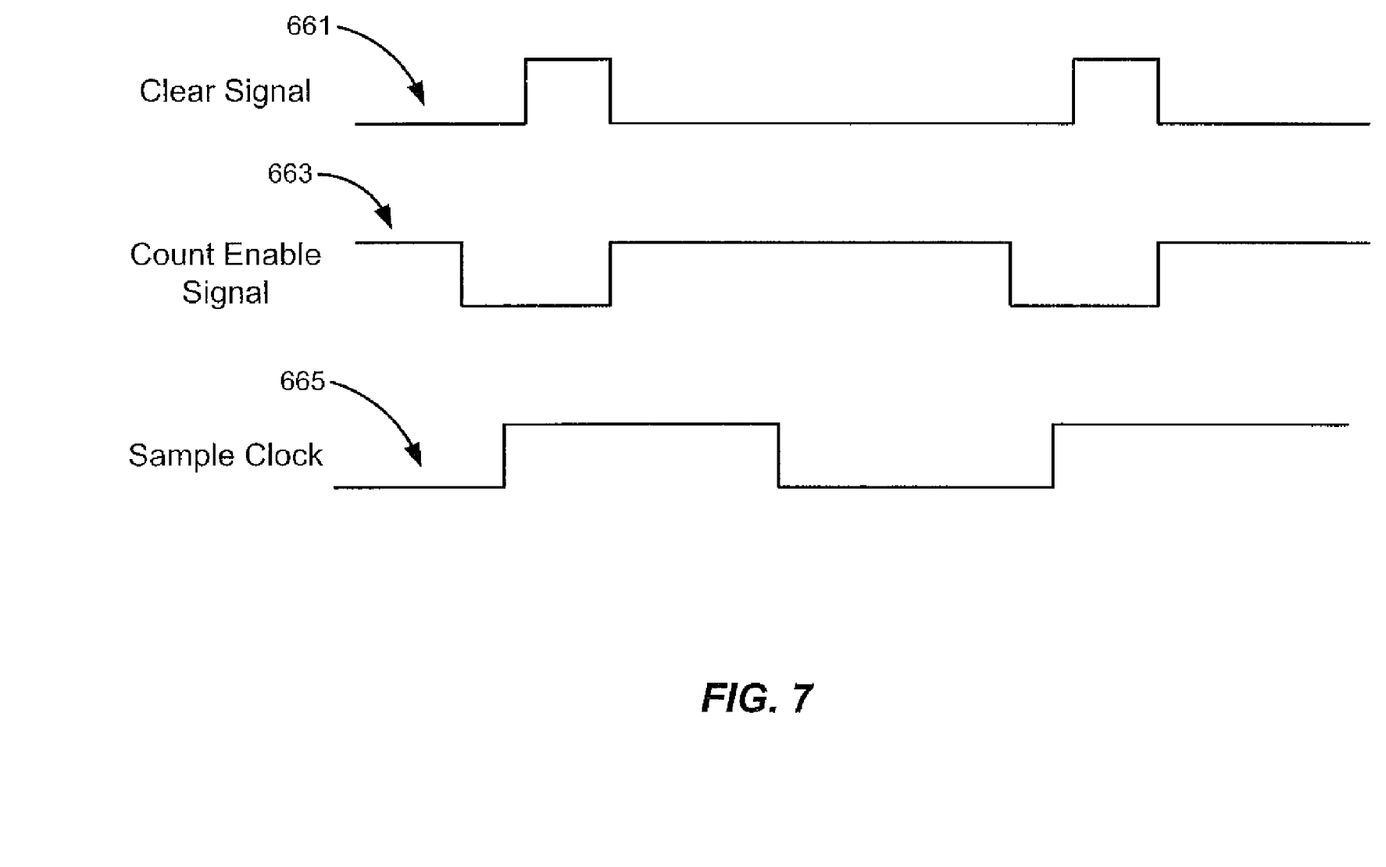
FIG. 7 is still another timing diagram, here depicting example approximate timing relationships among various control signals.

Controller 670, for this particular example embodiment, may comprise any of a wide range of processors and/or logic capable of performing processes, such as those discussed herein, for example. For an embodiment, controller 670 may comprise a hardwired state machine. For another example embodiment, controller 670 may comprise a programmable processor capable of executing software or firmware instructions stored in a storage medium. However, these are merely examples of types of controllers that may be utilized in accordance with claimed subject matter, and the scope of claimed subject matter is not limited to these examples. Many other controllers that are possible are intended to be included within the scope of claimed subject matter. FIG. 7 is an example timing diagram depicting approximate timing relationships among various control signals, for example, may be generated by pulse generator 660 for this particular embodiment. For example, pulse generator 660 may generate a clear signal 661, a count enable signal 663, and a sample clock signal 665, for this particular embodiment; although claimed subject matter is not limited in scope in this respect. Clear signal 661 may, for example, be employed to signal to comparator 900 to clear the previous state and to wait to receive input signals to compare. Count enable signal 663 may, for example, be employed to signal enabling a counting operation of pulse detector 660 within comparator 900, described above in connection with comparator 900 and shown in FIG. 9. Sample clock signal 665 for an embodiment, if asserted, may signal to pulse detector 660 in comparator 900 to sample the q output signal value level of flip-flop 950, for this particular embodiment. Further, sample clock signal 665 for an embodiment may provide a clock signal for controller 670. However, these are merely examples of possible control signals, associated timing relationships, functionality and purposes. The scope of claimed subject matter is not limited to these examples that may be possible.

As mentioned previously, for this example embodiment, two samplers and two corresponding phase interpolators are utilized, although the scope of claimed subject matter is not limited in these respects. One possible advantage from employing a relatively small number of samplers and phase interpolators may occur in the area of power consumption, for example. Other approaches that employ more samplers or phase interpolators, etc., may consume more power during operation. Also, the relatively small number of such components may provide a benefit of reduced capacitive loading as compared to approaches that employ more of such components.

For the example embodiments described herein, referring again to FIG. 2, clock/data recovery unit 600 may provide recovered clock signal 611 to other units within HDTV 200, such as, for example, core logic unit 220. Similarly, signal value levels sampled from incoming data pulses 300 may be provided to other units via recovered data signal 631.

Figure 5:
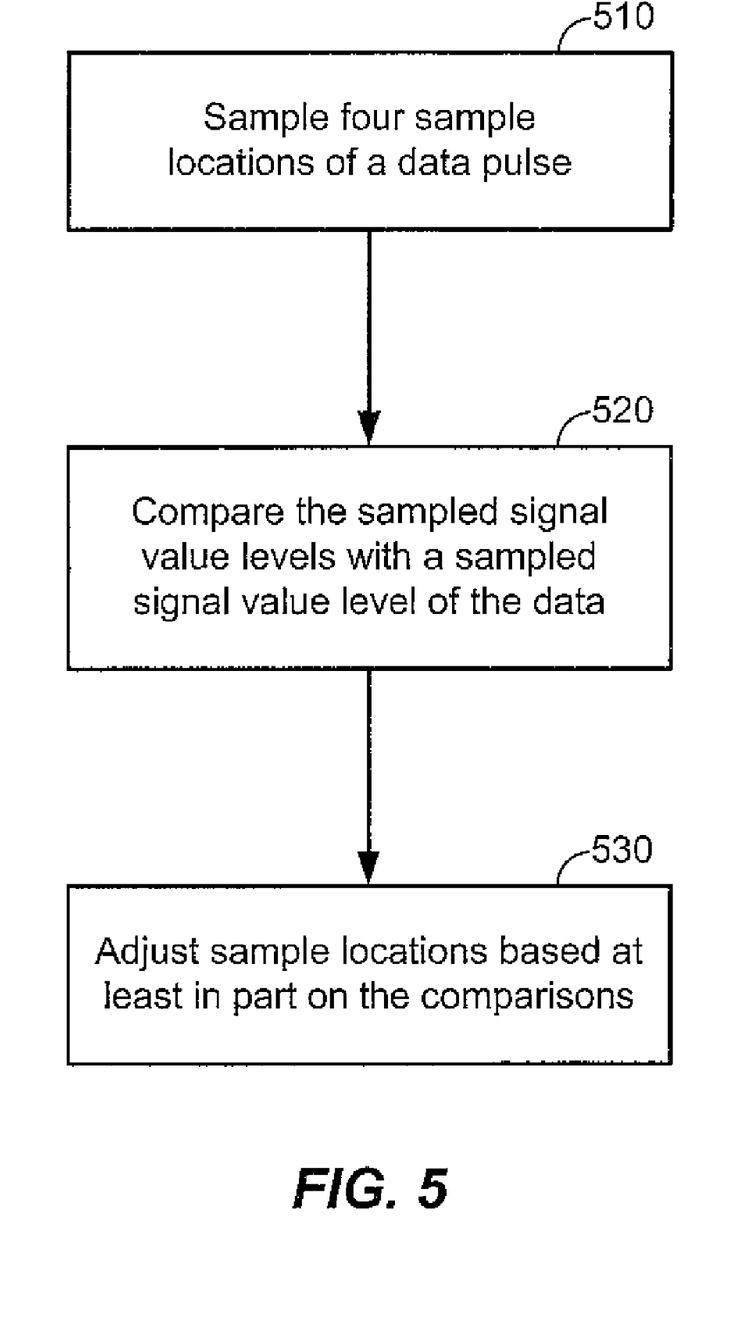
FIG. 5 is a flow diagram of an example embodiment of a method for clock and/or data recovery.

FIG. 5 is a flow diagram of an example embodiment of a method for clock and/or data recovery. For example, the previously described clock/data recovery unit using two samplers may perform this particular embodiment, although claimed subject matter is not limited in scope in this respect. At block 510, a relatively small number of distinct sample locations of a data pulse relative to an estimate of the location of a center of the data pulse may be sampled using two samplers to obtain sample signal value levels corresponding to the sample locations. Although this example embodiment describes the use of two samplers to sample four locations, other embodiments are possible that utilize other numbers of samplers and sample locations. At block 520, comparisons may be made of the respective sampled signal value levels of the sample locations for the two samplers for a number of data pulses, and at block 530 the sample locations may be adjusted based, at least in part, on the comparisons. Of course, this is merely an example of an embodiment of a process for adjusting sample locations, and the scope of claimed subject matter is not limited to this example. Embodiments in accordance with claimed subject matter may, of course, include more than all, or less than all of blocks 510-530. Furthermore, a number of operations may be performed at various times, and the scope of the claimed subject matter is not limited to the particular order illustrated for particular operations.

Figure 10:
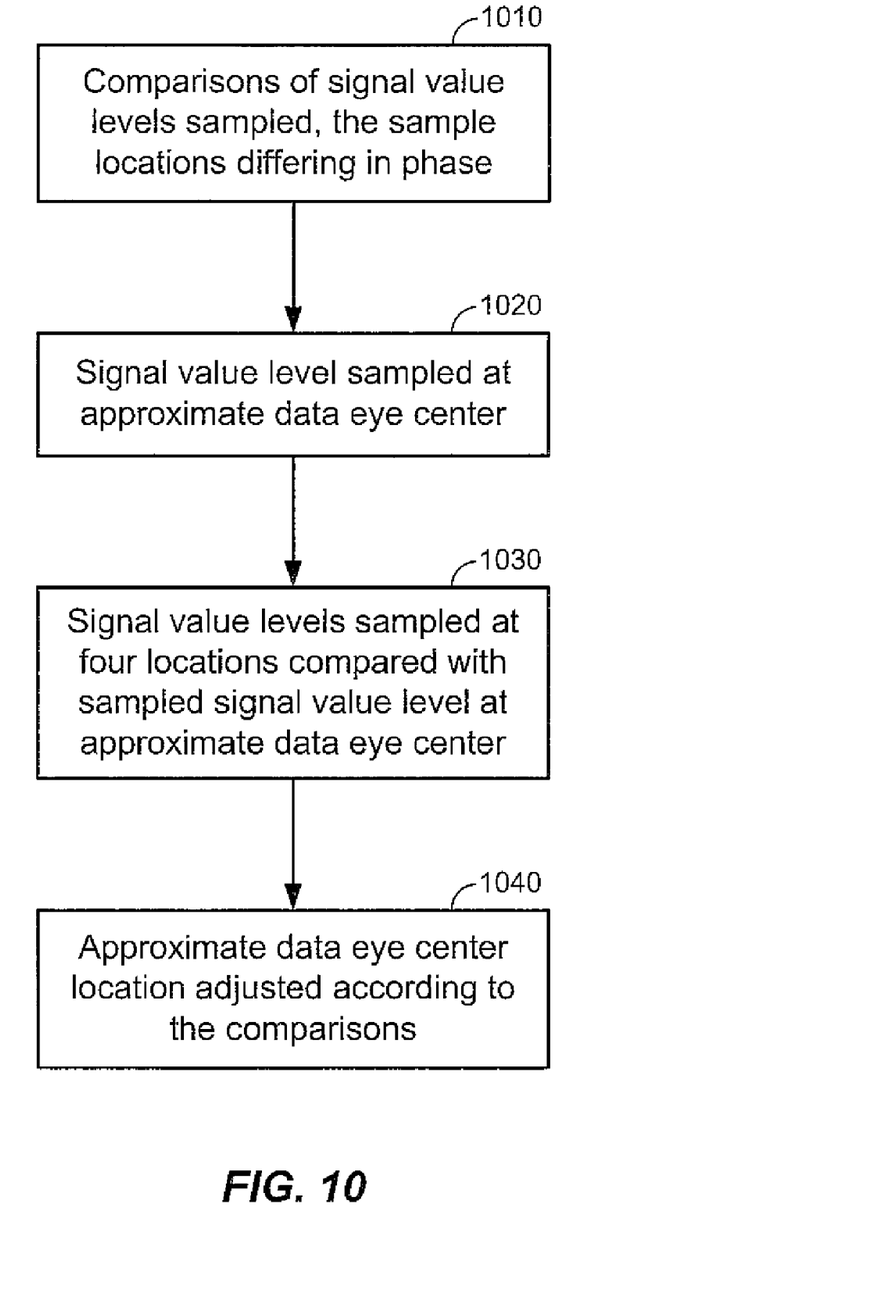
FIG. 10 is a flow diagram of another example embodiment of a method for clock and/or data recovery.

For comparison, FIG. 10 is a flow diagram of another example embodiment of a method for clock and/or data recovery. The previously described clock/data recovery unit using two samplers may perform this particular embodiment as well, although, again, claimed subject matter is not limited in scope in this respect. At block 1010, comparisons of signal value levels sampled at a variety of sample locations of a data pulse, the sample locations differing in phase, may be performed to determine an approximate data eye center. At block 1020, signal value level may be sampled at the approximate data eye center. At block 1030, at four sample locations, signal value levels may be performed and compared with the signal value level sampled at the approximate data eye center. At block 1040, the approximate data eye center location may be adjusted according to the comparisons. This embodiment is merely an example, and the scope of claimed subject matter is not limited in this respect. Embodiments in accordance with claimed subject matter may, of course, include more than all, or less than all of blocks 1010-1040. Furthermore, a number of operations may be performed at various times, and the scope of the claimed subject matter is not limited to the particular order illustrated for particular operations.

Data eye tracking processes, such as those described herein, for example may be performed at a variety of different times. For example, data eye tracking may be performed upon start up of HDTV 200 or upon a connection of HDMI compliant or HDMI compatible interconnect 115. Likewise, such processes may be performed during a training period set aside for calibration operations, although the scope of claimed subject matter is not limited in this respect. Likewise, such processes may also be performed during data transmission operations. In other embodiments, the data eye tracking operations may be performed continually during data transfer operations, and/or may be performed on a periodic basis. These are merely examples of times at which the data eye tracking processes may be performed, and the scope of claimed subject matter is not limited to these few examples, of course.

Figure 11:
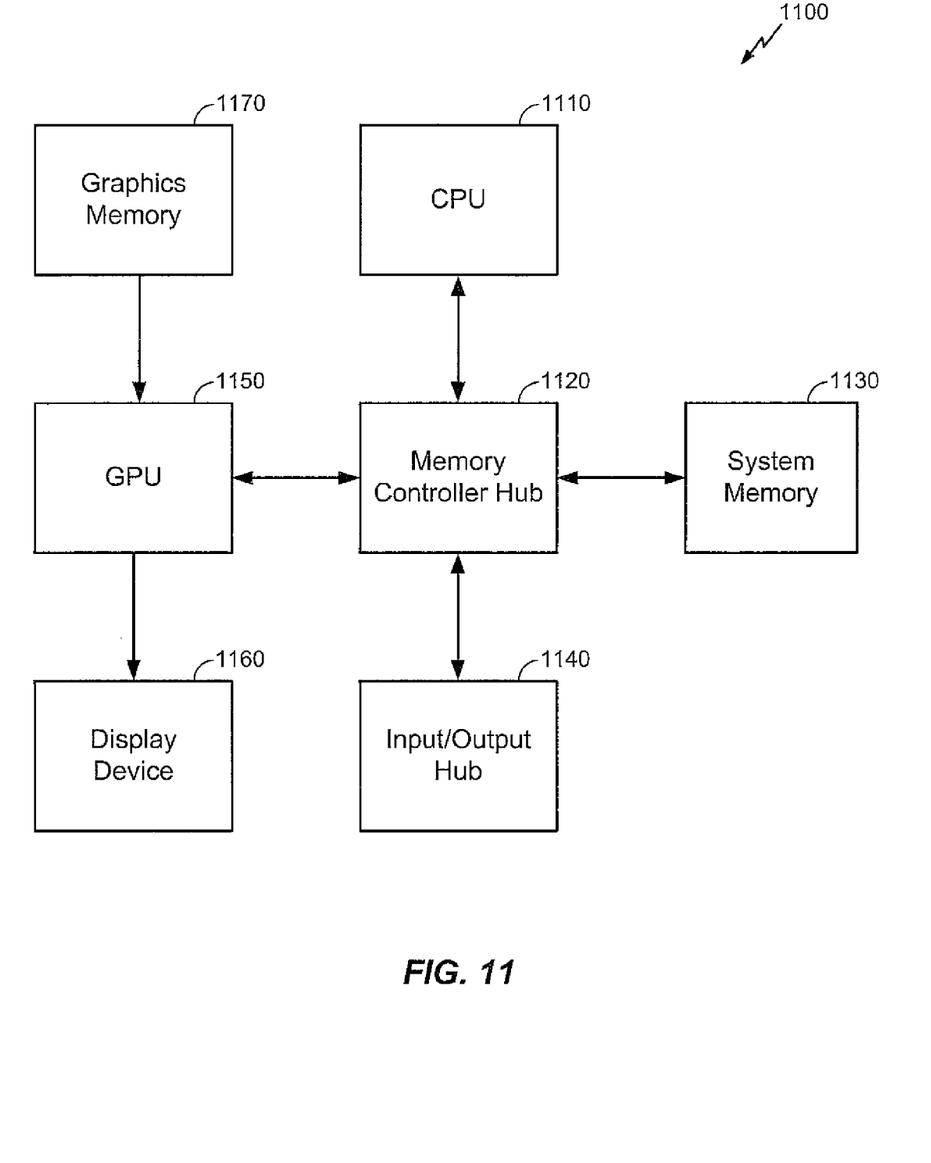
FIG. 11 is a block diagram of an example embodiment of a computing platform.

FIG. 11 is a block diagram of an example embodiment of a computing platform 1100. Embodiments described above mention clock and/or data recovery for interconnects between separate devices, as illustrated in FIG. 1; however, other embodiments are also possible for interconnects between components within a single device or between units within a monolithic semiconductor device. Computing platform 1100 merely represents one possible computing platform configuration, and the scope of claimed subject matter is not limited in this respect. However, a host of clock and/or data recovery embodiments within the scope of claimed subject matter may be implemented in connection with the components depicted in computing platform 1100, for example; although, this is merely another example, and claimed subject matter is not limited in scope to this example.

Computing platform 1100 may comprise a CPU 1110 and a memory controller hub 1120 coupled to CPU 1110. Memory controller hub 1120 is further coupled to a system memory 1130, to a GPU 1150, and to an input/output hub 1140. GPU 1150 is further coupled to a display device 1160, which may comprise a CRT display, a flat panel LCD display, or other type of display device. Also coupled to GPU 1150 is a graphics memory 1170. For this example embodiment, graphics memory 1170 may be coupled to GPU 1150 via a parallel data interface or interconnect, and input/output hub 1140 may be coupled to memory controller hub 1120 via a serial data interface or interconnect. System memory 1130 may, for an embodiment, have stored thereon instructions, that, if executed by CPU 1110 and/or by controller 670, may direct the computing platform to perform at least in part clock and/or data recovery processes, for example, such as those previously described, although claimed subject matter is not limited in scope in this respect.

In the preceding description, various aspects of claimed subject matter have been described. For purposes of explanation, systems or configurations were set forth to provide an understanding of claimed subject matter. However, claimed subject matter may be practiced without those specific details. In other instances, well-known features were omitted or simplified so as not to obscure claimed subject matter. While certain features have been illustrated or described herein, many modifications, substitutions, changes or equivalents will now occur to those skilled in the art. It is, therefore, to be understood that the appended claims are intended to cover all such modifications or changes as fall within the true spirit of claimed subject matter.

The invention claimed is:
1. A method comprising:
sampling a number of data pulses with two samplers at distinct sample locations of the data pulses, the sample locations being relative to an estimate of the location of a center for the data pulses;
comparing, respectively, the signal level values of the sample locations for the number of data pulses; and
adjusting the sample locations for a number of other data pulses based at least in part on the comparisons.

2. The method of claim 1, wherein one of the sample locations comprises a location at the approximate estimate of the location of the center of the data pulses.

3. The method of claim 2, wherein said sampling with two samplers comprises sampling with no more than two samplers.

4. The method of claim 2, further comprising revising the estimate of the location of the center for the number of other data pulses based, at least in part, on the comparisons.

5. The method of claim 1, wherein the sample locations comprise a relatively small number of sample locations.

6. The method of claim 5, wherein the relatively small number of sample locations is used to detect edges of a data eye for the data pulses.

7. The method of claim 6, wherein the sample locations used to detect edges of a data eye for the data pulses comprise four sample locations approximately at −100°, at −80°, at +80°, and at +100°, respectively, relative to the estimate of the center of the data pulses.

8. The method of claim 1, wherein said comparing comprises comparing signal value levels sampled at the sample locations with a signal value level sampled at the estimate of the center of the data pulses.

9. The method of claim 8, wherein said adjusting comprises advancing the sample locations if the comparisons detect that the signal level sampled at a latest sample location is different from that of the signal level sampled at the estimate of the center of the data pulses.

10. The method of claim 8, wherein said adjusting comprises retarding the sample locations if the comparisons detect that the signal level sampled at an earliest sample location is different from that of the signal level sampled at the estimate of the center of the data pulses.

11. A system, comprising:
a transmitting device; and
a receiving device couple to the transmitting device via an interconnect, wherein said receiving device comprises
a first sampler and a second sampler to sample a relatively small number of distinct data sample phase locations of a data pulse received via the interconnect relative to an estimate of the location of a center of the data pulse;
a comparator to compare, respectively, the signal level of the distinct data phase locations for the two samplers for a number of data pulses; and
a controller to adjust the relatively small number of distinct data sample phase locations based at least in part on the comparisons.

12. The system of claim 11, wherein the receiving device comprises a high definition television.

13. A method, comprising:
performing a first plurality of comparisons of data sampled at a first sample point and at a second sample point at a first plurality of phase offsets to determine an approximate data eye center, wherein a phase relationship between the first and second sample points is fixed when determining the approximate data eye center;

fixing the second sample point at the approximate data eye center;
performing a second plurality of comparisons of data sampled at the first sample point at a second plurality of phase offsets to determine a movement of a data edge, wherein the second sample point remains fixed at the approximate data eye center and wherein the phase relationship between the first and second sample points is not fixed when determining the movement of the data edge; and
adjusting the approximate data eye center according to the determined movement of the data edge.

14. An apparatus, comprising:
a first phase interpolator and a second phase interpolator to receive a multi-phase clock from a multi-phase clock generating circuit, the first and second phase interpolators to produce first and second clock signals, respectively;
a first sampler circuit and a second sampler circuit to receive the first and second clock signals, respectively, from the first and second phase interpolators, the first and second sampler circuits further to receive a data signal via a data input line;
a comparator to receive first and second pluralities of sampled data from the first and second sampler circuits, respectively, the comparator to perform a first plurality of comparisons of data sampled at the first and second sample points at a first plurality of phase offsets to determine an approximate data eye center, wherein a phase relationship between the first and second clock signals is fixed when determining the approximate data eye center; and
a controller circuit to fix the second sample point at the approximate data eye center, the controller circuit to deliver timing information to the first and second phase interpolators, the comparator to perform a second plurality of comparisons of data sampled at the first sampler circuit at a second plurality of phase offsets to determine a movement of a data edge, wherein the second sample point remains fixed at the approximate data eye center and wherein the phase relationship between the first and second clock signals is not fixed when determining the movement of the data edge, the controller to adjust the approximate data eye center according to the determined movement of the data edge.

15. A clock and/or data recovery unit, comprising:
only two samplers to sample signal value levels of a data pulse at distinct, respective sample locations;
only two phase interpolators to drive, at least in part, the two samplers; and
a controller to adjust, at least in part, the sample locations for the two samplers, so that one sampler tracks the data pulse transition edge, the other tracks an estimate of the center of the data pulse.

* * * * *